(12) United States Patent
Bruekers et al.

(10) Patent No.: US 7,016,846 B2
(45) Date of Patent: Mar. 21, 2006

(54) ROBUST CHECKSUMS

(75) Inventors: Alphons Antonius Maria Lambertus Bruekers, Eindhoven (NL); Jaap Andre Haitsma, Eindhoven (NL); Minne Van Der Veen, Eindhoven (NL); Antonius Adrianus Cornelis Maria Kalker, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 770 days.

(21) Appl. No.: 10/047,031

(22) Filed: Jan. 15, 2002

(65) Prior Publication Data

US 2002/0105907 A1   Aug. 8, 2002

(30) Foreign Application Priority Data

Jan. 17, 2001   (EP) ................................. 01200165
Aug. 3, 2001   (EP) ................................. 01202959

(51) Int. Cl.
*H04K 1/00* (2006.01)
*G10L 21/00* (2006.01)
*G10L 21/02* (2006.01)

(52) U.S. Cl. ........................................ 704/273; 704/226
(58) Field of Classification Search ................ 704/226, 704/273; 705/51; 380/28; 713/176
See application file for complete search history.

(56) References Cited

U.S. PATENT DOCUMENTS 6,021,491 A   2/2000   Renaud ....................... 713/179

FOREIGN PATENT DOCUMENTS

WO   WO9515522   8/1995

OTHER PUBLICATIONS

Fridrich et al., "Robust Hash Fucntions for Digital Watermarking," ITCC 2000, Las Vegas, Nevada, Mar. 27-29, 2000, pp. 173-178.*

Lin, Ching-Yung, "Watermarking and Digital Signature Techniques for Multimedia Authentication and Copyright Protection," PhD thesis in the graduate school of arts and sciences at Columbia University, Dec. 2000.*

Lin et al: "Issues And Solutions For Authenticating MPEG Video" Proceedings Of The SPIE , SPIE Bellingham, VA, US, vol. 3657, Jan. 25, 1999, pp. 54-65.

Schneider et al: "A Robust Content Based digital Signature For Image Authentication" Proceedings Of The International Conference On Image Processing (ICIP) Lausanne, Sep. 16-19, 1996, New York, IEEE, US, vol. 3, Sep. 16, 1996, pp. 227-230.

* cited by examiner

*Primary Examiner*—Richemond Dorvil
*Assistant Examiner*—V. Paul Harper

(57) ABSTRACT

The invention relates to a method of checking the correct operation of a signal transformation wherein a input signal is transformed into an output signal. The method comprises: deriving a first robust feature from the input signal; deriving a second robust feature from the output signal; comparing said first and second robust features; in case of sufficient sumilarity, concluding a correct operation of said signal transformation, and in case of insufficient sumilarity, concluding a false operation of said signal transformation. In a special embodiment, the method is applied wherein the first robust feature is embedded in the input signal through watermark technology, the thus obtained signal being transmitted to a receiver so as to retrieve an output signal corresponding to said input signal.

20 Claims, 3 Drawing Sheets

ROBUST CHECKSUMS

The invention relates to a method of analyzing the correctness of an output signal, the output signal being obtained from transformation of an input signal. In particular the invention relates to a method of checking the correct operation of a lossy transformation. In such transformation, parts of the signal are deleted in a signal-theoretical sense, but, for human perception, the signal remains substantially unchanged. The invention also relates to a signal analyzer, more particularly, to a receiver and/or to a transmitter adopting the method of the invention.

Lossy transformations are to be seen in contrast to lossless transformations, such as, for example, a lossless compression, or other forms of lossless data encoding. In a lossless transformation of a signal, there remains a one-to-one relation between an input signal and an output signal, or, alternatively, in a transmission of a signal, there remains a one-to-one relation between a transmitted and a received signal. In this respect, a lossless encoder provides an encoded signal that is, after decoding, bit by bit identical with its input signal. So, for such coding transformations, that is, transformations, where a signal is encoded and in a later stage decoded, it is possible to add verification means to the data to ensure data integrity during the transformations. Such verification is necessary, since received data may be erroneous owing to noise or damage. It is also possible that in the decoding step, after reception of the signal, errors are introduced due to hardware or software defects. The mere untreated transmission of erroneous signals may of course lead to annoying or even intolerable effects like, for instance, in audio systems, too high noise levels.

One way of verifying the correctness of the received data is as follows: in the transmitter a checksum is derived and added to the data. In the receiver again a checksum is derived and compared with the checksum as received from the transmitter. If the two checksums are identical, the transmission is assumed to be correct, and if the two checksums differ, the received data is assumed to be erroneous.

Equality of both checksums implies, with a large probability, that the received data is bit by bit identical with the transmitted data. Small distortions of the data will cause the checksums to be different. If a checksum is different, a correction scheme can be followed in outputting the data, for example, the data can be retransmitted, muted or interpolated. In this way, the outputting of erroneous signals is prevented or at least treated in an acceptable manner.

In a lossy encoder, the above described method can not be applied. In a lossy encoded transmission, parts of the signal will be lost, hence the term lossy. Thus, even under normal conditions, although the difference is perceptually not relevant, there is no bit-by-bit accurate mapping between input and output signal. Therefore, checksums of data on the transmitter side will differ from the data on the receiver side, so a differing checksum is not an indication of an erroneous transformation of the signal.

The invention aims to overcome this problem and provide a method to check the correct operation of a signal transformation, wherein, even in a lossy transformation, a robust verification can be performed, to ensure data integrity during transformations. In this respect, the term robust is introduced, to identify a verification procedure which is, up to a certain extent, invariant to data processing (as long as the processing retains an acceptable quality of the content). In this way, the correctness of a signal transformation can be assessed, even if the transformation is lossy, like for instance in compression algorithms, wherein large parts of the signal are deleted because they are not relevant to human perception.

Accordingly, the method of the invention comprises the steps of:
receiving a first robust feature derived from an input signal, wherein the input signal has been transformed into the output signal by the signal transformation;
deriving a second robust feature from the output signal; and
identifying a degree of similarity between said first robust feature and said second robust feature.

In a further embodiment, the method may comprise the step of correcting the output signal into a corrected signal, in dependence on said degree of similarity.

The method according to the invention is especially applicable in the field of datatransmission, where data (usually in a compressed format) are transmitted in association with their robust features. So, in a preferred embodiment, the method of the invention comprises the steps of: encoding the input signal into an encoded signal, and transmitting the encoded signal and the first robust feature.

The method may also comprise receiving an encoded signal, and decoding said encoded signal into an output signal.

Although the robust feature may be sent in a separate channel, in a special embodiment of the invention, the method comprises the step of embedding the first robust feature into the encoded signal through watermark technology.

A preferred way of deriving a robust feature from each of said input and output signals is by splitting an information signal into successive time intervals, and computing a hash value from a scalar property or vector of properties of the information signal within each time interval.

In a still further preferred embodiment, deriving a robust feature from each of said input and output signal comprises: transforming the information signal within the time interval into disjoint bands, calculating a property of the signal in each of said bands, comparing the properties in the bands with respective thresholds, and representing the results of said comparisons by respective bits of the hash (sample) value.

Said bands may be frequency bands having an increasing bandwidth as a function of the frequency. Said property may be the energy of a band; said property may also be the tonality of a band. Other bands and properties are also feasible.

Although the method can be applied to any kind of transformation, the method is advantageously applied when the transformation is a lossy transformation.

In one specific preferred embodiment, the method comprises:
a) calculating from the input signal a first block of subsequent hash values corresponding to a first time interval;
b) calculating from the output signal a second block of subsequent hash values corresponding to a second time interval, at least partially overlapping said first interval;
c) selecting one hash value from one of said first and second blocks of hash values;
d) searching for said hash value in the other one of said first and second blocks of hash values;
e) calculating a difference between the first and second blocks of hash values in which the hash value found in step (d) has the same position as the selected hash value in the other one of said first and second blocks;

f) repeating steps (c)–(e) for a further selected hash value until said difference is lower than a predetermined threshold, or until the number of hash values to be selected is lower than a predetermined threshold;

g) concluding a correct operation of said signal transformation if the difference is lower than a predetermined threshold or concluding to a false operation of said signal transformation if the number of hash values to be selected is lower than a predetermined threshold.

The latter embodiment is particularly preferable, in case no fixed frame boundaries are present in the signal.

In this embodiment, the further selected hash value may be another hash value of the first block of hash values. Alternatively, the further selected hash value may be obtained by reversing a bit of the previously selected hash value. In a still further embodiment, the method comprises the steps of receiving information indicative of the reliability of the bits of the selected hash value, and using said information to determine whether or not to use the selected hash value. Alternatively, the method may further comprise the steps of receiving information indicative of the reliability of the bits of the selected hash value, and using said information to determine the bit to be reversed.

The invention also relates to a receiver, comprising: receiving means for receiving a first robust feature derived from an input signal, wherein the input signal has been transformed into the output signal by the signal transformation;

analysing means for deriving a second robust feature from the output signal; and comparing means for identifying a degree of similarity between said robust feature and a second robust feature derived from an input signal.

The receiver may be a radio, television, computer or any other device receiving such signals together with their robust features, but it may also be a microcircuit or part of a circuit receiving said signals.

In one embodiment the receiver comprises correcting means responsive to the comparing means, for correcting the output signal into a corrected signal.

In a further embodiment, the receiver receives an encoded signal from a transmitter the receiver further comprising: decoding means for transforming the encoded signal into an output signal.

The invention also relates to a transmitter, suitable for transmitting encoded signals to be received by said receiver, the transmitter comprising: analyzing means for deriving a first robust feature from an input signal;

encoder means for encoding the input signal into an encoded signal; and transmitting means for transmitting the encoded signal and the first robust feature.

The invention also relates to a data carrier comprising a data channel corresponding to a multimedia signal and a data channel corresponding to a robust feature associated to said multimedia signal.

Further objects and features of the invention will become apparent from the drawings, wherein, FIG. 1 shows an illustration of a lossless encoding process;

In the drawings, like or the same parts are referenced by the same numerals.

Figure 1:
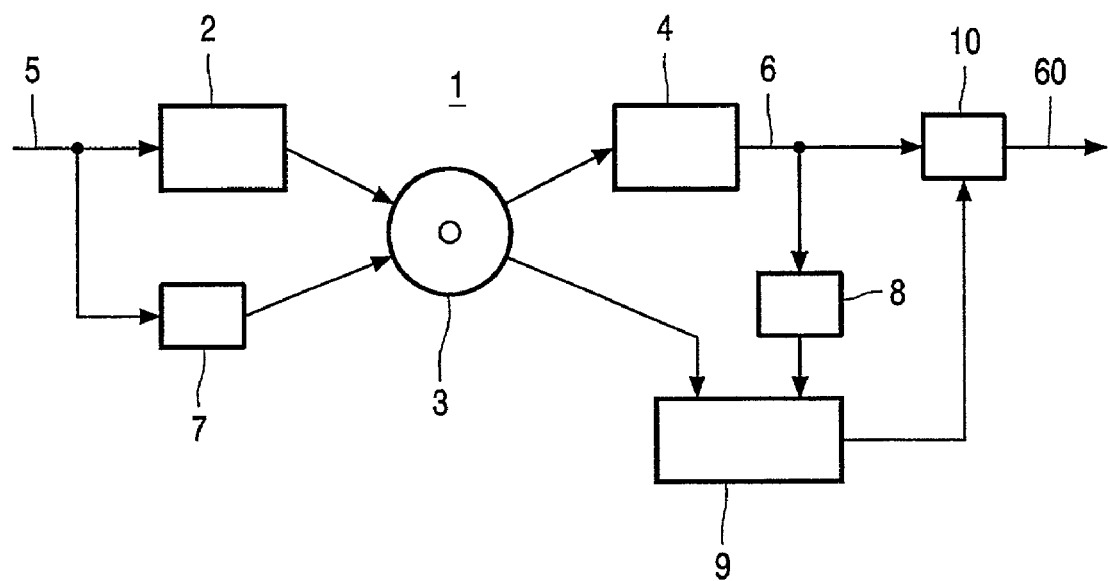

The lossless process, illustrated schematically in FIG. 1 by transformation channel 1, is illustrative for a newly developed high-quality audio system for consumer application: Super Audio CD or SACD, although the process may be applied in other areas of technology as well, such as, for instance, video or other multimedia signal processing. The transmission channel 1 consists among others of a lossless encoder 2, a disk 3 on which a signal encoded by the encoder 2 is stored, and a lossless decoder 4. To check the digital audio signals from begin (input signal 5) to end (output signal 6), checksums 7, 8, respectively, are introduced. At playback a comparator 9 compares on a frame-by-frame basis the checksum 7 of the input signal 5 before the lossless encoder 2 with the checksum 8 of the output signal 6 after the lossless decoder 4. It is then possible to detect errors in the lossless encoding/decoding transformation, because an error will cause a difference between the two checksums. In case of an error in the output signal 6, a corrector 10 will mute the signal, or produce an otherwise corrected signal 60. A reason to check for an error in the coding system is that such an error may result in high-level noise signals, which are at least annoying.

As is apparent from FIG. 1, the process of checking the correct operation of encoding/decoding transformation is not suitable in case the audio encoder 2 is a lossy encoder instead of a lossless encoder. Lossy means that, in a signal-theoretic sense, there is a difference between the input and the output signal, but that such a difference is perceptually not relevant. This implies that even under normal conditions the input 5 and output signal 6 are not accurate bit-by-bit; therefore a checksum cannot be used, since such checksums, even when the transformation is performed correctly, would not match. Of course, also in a lossy encoding process, some parameters are transmitted losslessly, so that some checksum on these intermediate results can be used, but a begin-to-end check is not possible.

In a transmission channel 1 according to FIG. 1, when audio encoder 2 is a lossy encoder, input and output signals may differ quite drastically (e.g. by compression/decompression). Yet, the human perceptual system (HPS) has no problem in recognizing the 'sameness'. If the HPS considers the input and output signals "the same", a hash function should also produce substantially the same hash signal, that is, that from a degree of similarity between the respective hash signals, a degree of "sameness" of the signals can be derived. In this respect, a hash function should not only be able to identify the content, but should also be able to identify time (intervals). For this reason the following definition for a robust hash is herein used:

A robust hash is a function that associates to every basic time-unit of audio content a semi-unique bit-sequence that is continuous with respect to content similarity as perceived by the HPS.

In other words, if the HPS identifies two signals as being very similar, the associated hash values should also be very similar. In particular, if we compute the hash values for original content and transformed content, the hash values should be similar. On the other hand, if two signals really represent different content, the robust hash should be able to distinguish the two signals (semi-unique). The required robustness of the hashing function is achieved by deriving the hash function from robust features (properties), i.e. features which are largely invariant to processing.

Figure 2:
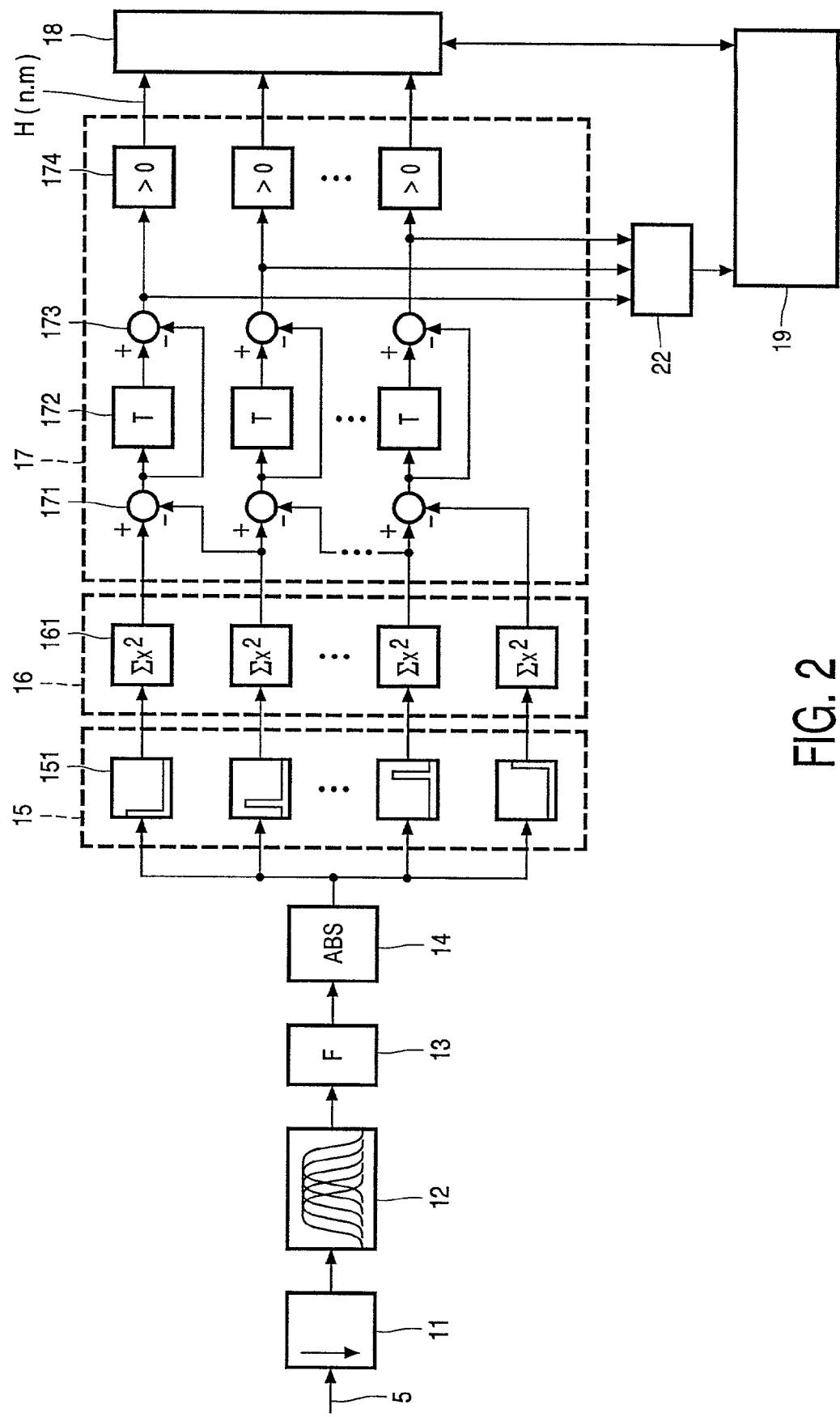
FIG. 2 shows an illustration of deriving a robust feature from a signal.

FIG. 2 shows a schematic diagram of an arrangement for generating a robust feature from an input signal. The signal, in the example of FIG. 2 being an audio signal 5, is first downsampled in a downsampler 11 to reduce the complexity of subsequent operations and restrict the operation to a frequency range from 300–3000 Hz, which is most relevant for the human auditory system (HAS).

In a framing circuit 12, the audio signal is divided into frames with an overlap factor of 31/32. The overlap is chosen in such a way to ensure a high correlation of the hash values between subsequent frames. The spectral representation of every frame is computed by a Fourier transform circuit 13. In the next block 14, the absolute value of the (complex) Fourier coefficients is computed.

A band division stage 15 divides the spectrum into a number (e.g. 33) of bands. In FIG. 2, this is schematically shown by selectors 151, each of which selects the Fourier coefficients of the respective band. In a preferred embodiment of the arrangement, the bands have a logarithmic spacing, because the HAS also operates on approximately logarithmic bands. By choosing the bands in this manner, the hash value will be less susceptible to processing changes such as compression and filtering. In the preferred embodiment the first band starts at 300 Hz and every band has a bandwidth of one musical tone (i.e. the bandwidth increases by a factor of $21/12 \approx 1.06$ per band).

Next, for every band a certain (not necessarily scalar) characteristic property is calculated. Examples of properties are energy, tonality and standard deviation of the power spectral density. In general the chosen property can be an arbitrary function of the Fourier coefficients. Experimentally it has been verified that the energy of every band is a property that is most robust to many kinds of processing. This energy computation is carried out in an energy computing stage 16. For each band it comprises a stage which computes the sum of the absolute values of the Fourier coefficients in the band.

In order to get a binary hash value, the robust properties are subsequently converted into bits. The bits can be assigned by calculating an arbitrary function of the robust properties of possibly different frames and then comparing it to a threshold value. The threshold itself might also be a result of another function of the robust property values.

In the present arrangement, a bit derivation circuit 17 converts the energy levels of the bands into a binary hash value. In a simple embodiment, the bit derivation stage generates one bit for each band, for example, a '1' if the energy level is above a threshold and a '0' if the energy level is below said threshold. The thresholds may vary from band to band. Alternatively, a band is assigned a hash value bit '1' if its energy level is larger than the energy level of its neighbor, otherwise the hash value bit is '0'. The present embodiment uses an even improved version of the latter alternative. To avoid that a major single frequency in the audio signal would produce identical hash values for successive frames, variations of the amplitude over time are also taken into account. More particularly, a band is assigned a hash value bit '1' if its energy level is larger than the energy level of its neighbor and if that was also the case in the previous frame, otherwise the hash value bit is '0'. The specific form of the hash function may vary for different embodiments.

To this end, the bit derivation circuit 17 comprises for each band a first subtractor 171, a frame delay 172, a second subtractor 173, and a comparator 174. The 33 energy levels of the spectrum of an audio frame are thus converted into a 32-bit hash value H(n.m.). The hash values of successive frames are finally stored in a buffer 18, which is accessible by a computer 19.

Figure 3:
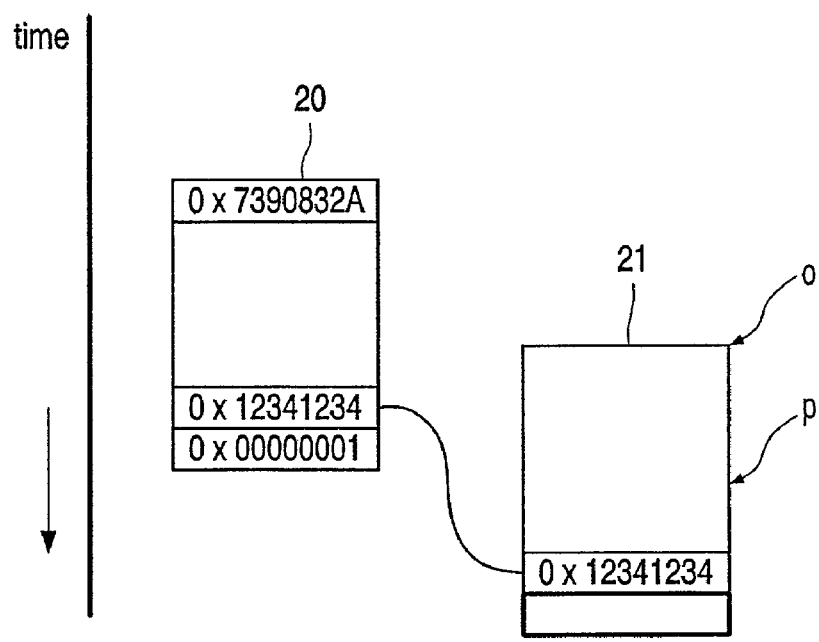
FIG. 3 shows an illustration comparing the robust features of input and output signal.

In FIG. 3 is illustrated how a hash signal as derived from the input signal shown in FIG. 2, is compared with another hash signal as derived in a similar manner as shown in FIG. 2 for an output signal. In this respect, two blocks 20 and 21, corresponding to the input signal and the output signal, respectively, of "robust" hash values are present, with overlapping time intervals.

In a first embodiment of the matching method, it will be assumed that every now and then a single hash value has no bit errors. A single hash value is selected from the first hash block 20 and matched with a hash value of the second hash block 21. Initially, the selected hash value will be the last hash value of the first hash block 20. In the example shown in FIG. 3, this is the hash value 0x00000001. Let us say that this hash value is present on position p, which, as can be seen from the Figure, apparently does not correspond to the right position. In a further step the computer calculates the bit error rate (BER, defined as the ratio of the number of erroneous bits and the total number of bits) between hashes of the first hash block and hashes of the second block of hash values present on position 0 up to position p. In a further step is checked whether the BER is low (<0.25) or high. If the BER is low, the probability is high that the two hash blocks match, in which case it is concluded that the signal transformation has been performed correctly. If the BER is high, either the signal transformation has not been performed correctly, or the previously selected single hash value contains an error. The latter will be assumed to be the case in this example. Another single hash value is then selected, for instance, as illustrated in FIG. 3 the last but one single hash value. This hash value appears to occur in the second block, apparently, as is shown in the Figure, on the right position. If the BER between input block hash and output block appears to be lower than for example 0.25, it is concluded to a correct operation of said signal transformation.

The computer thus only looks at one single hash value at a time and assumes that every now and then such a single hash value has no bit errors. The BER of the extracted hash block is then compared with the (on the time axis) corresponding hash blocks. If the BER is below the threshold it will be concluded that the signal was transformed correctly, otherwise another single hash value will then be tried. If none of the single hash values leads to success, a false operation of said signal transformation will be concluded.

The above described method relies on the assumption that every now and then an extracted hash value has no bit errors, i.e. is perfectly equal to the corresponding stored hash value. However, it is unlikely that hash values without any bit errors occur when the signal is severely processed. Another embodiment of the matching method uses soft information of the hash extraction algorithm to find the extracted hash values in the database. By soft information is meant the reliability of a bit, or the probability that a hash bit has been retrieved correctly. In this embodiment, the arrangement for extracting the hash values includes a bit reliability determining circuit 22 (see FIG. 2). This circuit receives the differential energy band levels in the form of real numbers. If a real number is very close to the threshold (which is zero in this example), the respective hash bit is unreliable. If, instead, the number is very far from the threshold, it is a reliable hash bit. The bit reliability determining circuit 22 of FIG. 2 derives the reliability of every hash bit, and thus enables the computer 19 to generate a list of most probable alternative hash values for each hash value. By assuming again that at least one of the alternative hash values is correct, the two hash blocks can be matched.

Figure 4:
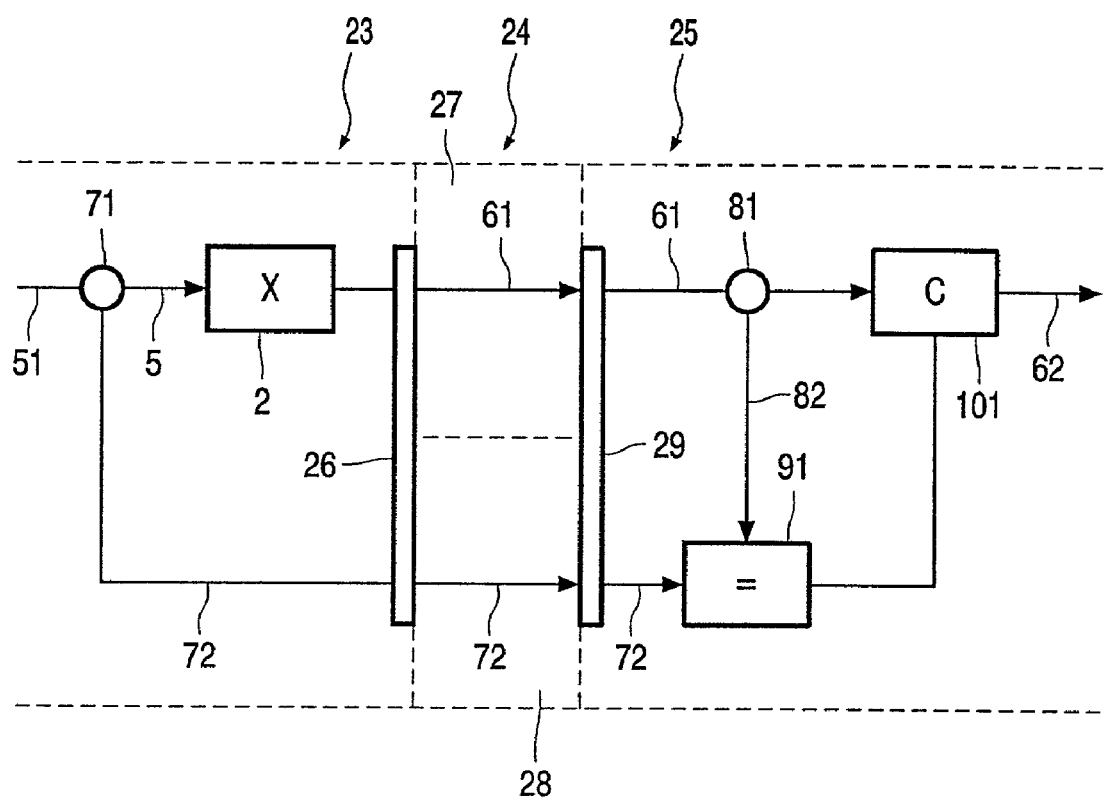
FIG. 4 shows a schematic embodiment of a transmitter transmitting data to a receiver, wherein the method according to the invention is applied.

Although such method according to the invention may be applied in a single electronic signal processing apparatus, an illustrative application of the method is depicted by FIG. 4 where dotted lines 23, 24 and 25, illustrate a transmitter, a data carrier and a receiver, respectively. The transmitter 23 is, for example, a multimedia signal transmitter, transmitting audio, video, speech, graphic images and the like. The transmission can be a wireless transmission, or a transmission over the Internet, in fact, any kind of transmission. The transmission can also be done via a physical data carrier, such as a magnetic disk or a CD-rom etc.

The transmitter comprises analyzing means 71 for deriving a first robust feature 72 from an input signal 51; encoder means 2 for encoding the input signal 51 into an encoded signal 61; and transmitting means 26 for transmitting the encoded signal 61 and the first robust feature 72. The analysing means 71 were explained with reference to FIG. 2 and may be embedded in hardware, software etc. The same applies for the encoder means 2, which may be general purpose compression software or any kind of dedicated encoding tool. Further, the transmitting means 26 may, for example, be a radio or tv-transmitter or a remote server on the Internet.

The data carrier 24 comprises a data channel 27 corresponding to the multimedia signal 61 and a data channel 28 corresponding to the robust feature 72 associated to multimedia signal 51. Obviously, the data carrier 24 may be a physical carrier, such as a magnetic disk or a CD-rom etc. but it may also be for instance an electromagnetic signal, that is broadcast through the air or via a physical network.

The receiver 25, which will be, for example, a television set, a CD-player or a multimedia computer, comprises a combination of receiving means 29 for receiving the first robust feature 72; analysing means 81 for deriving a second robust feature 82 from the output signal; and comparing means 91 for identifying a degree of similarity between said robust feature and a second robust feature 72. The receiver further has correcting means 101 responsive to the comparing means 91, for correcting the output signal 61 into a corrected signal 62. The receiving means 29 may be any kind of adequate readout means for picking up the data channels 27 and 28 of the data carrier 24, such as, for instance, an antenna, a modem or a magnetic or optical reading unit.

It will be clear to those skilled in the art that the invention is not limited to the embodiment described with reference to the drawing, but may comprise all kinds of variations thereof. Such variations are deemed to fall within the scope of protection of the appended claims.

REFERENCE NUMBERS
1. transformation channel
2. lossless encoder
3. disk
4. decoder
5. input signal
6. output signal
7. checksums
8. checksums
9. comparator
10. corrector
11. downsampler
12. framing circuit
13. circuit
14. block
15. stage
16. energy computing stage
17. circuit
18. buffer
19. computer
20. input block
21. output block
22. circuit
23. transmitter
24. data carrier
25. receiver
26. transmitting means
27. data channel
28. data channel
29. receiving means

What is claimed is:

1. A method of analyzing the correctness of an output signal, the method comprising the steps of:
   receiving the output signal, the output signal being obtained from signal transformation of an input signal,
   receiving a first robust feature, the first robust feature being derived from said input signal,
   deriving a second robust feature from the output signal;
   determining a reliability of a hash bit; and
   identifying a degree of similarity between said first robust feature and said second robust feature.

2. A method as claimed in claim 1, further comprising the step of:
   correcting the output signal into a corrected signal in dependence on said degree of similarity.

3. A method as claimed in claim 1, further comprising the steps of:
   encoding the input signal into an encoded signal; and
   transmitting the encoded signal and the first robust feature.

4. A method as claimed in claim 3, further comprising the step of embedding the first robust feature into the encoded signal through watermark technology.

5. A method as claimed in claim 1, further comprising the steps of:
   receiving an encoded signal;
   decoding said encoded signal into an output signal.

6. A method as claimed in claim 1, wherein for each of said input and output signals, a robust feature is derived by:
   splitting an information signal in successive time intervals; and
   computing a hash value from a scalar property or vector of properties of the information signal within each time interval.

7. A method as claimed in claim 1, wherein the transformation is a lossy transformation.

8. A receiver, comprising:
   means for receiving an output signal, the output signal being obtained from signal transformation of an input signal,
   receiving means for receiving a first robust feature, the first robust feature being derived from the input signal;
   analysing means for deriving a second robust feature from the output signal;
   a bit reliability determining circuit adapted to determine if a hash bit is reliable; and
   comparing means for identifying a degree of similarity between said first robust feature and a second robust feature derived from an input signal so as to obtain a similarity signal.

9. A receiver according to claim 8, further comprising correcting means for correcting the output signal into a corrected signal in dependence of said similarity signal.

10. A receiver according to claim 8, wherein the receiver further comprises
 receiving means for receiving an encoded signal from a transmitter,
 decoding means for transforming the encoded signal into the output signal.

11. A transmitter, suitable for transmitting encoded signals to be received by the receiver according to claim 10, comprising:
 analyzing means for deriving a first robust feature from an input signal;
 encoder means for encoding the input signal into an encoded signal; and
 transmitting means for transmitting the encoded signal and the first robust feature.

12. A method of analyzing the correctness of an output signal, the method comprising the steps of:
 receiving the output signal, the output signal being obtained from signal transformation of an input signal,
 receiving a first robust feature, the first robust feature being derived from said input signal,
 deriving a second robust feature from the output signal;
 identifying a degree of similarity between said first robust feature and said second robust feature in each of said time intervals, wherein in each of a plurality of time intervals a hash value is computed by:
 transforming the information signal within the time interval into disjoint bands;
 calculating a property of the signal in each of said bands;
 comparing the properties in the bands with respective thresholds; and
 representing the results of said comparisons by respective bits of the hash value.

13. A method as claimed in claim 12, wherein the bands are frequency bands having an increasing bandwidth as function of the frequency.

14. A method as claimed in claim 12, wherein said property is the energy of a band.

15. A method as claimed in claim 12, wherein said property is the tonality of a band.

16. A method of analyzing the correctness of an output signal, the method comprising the steps of:
 receiving the output signal, the output signal being obtained from signal transformation of an input signal,
 receiving a first robust feature, the first robust feature being derived from said input signal,
 deriving a second robust feature from the output signal; and
 identifying a degree of similarity between said first robust feature and said second robust feature; wherein the method further comprises:
 a) calculating from the input signal a first block of subsequent hash values corresponding to a first time interval;
 b) calculating from the output signal a second block of subsequent hash values corresponding to a second time interval, at least partially overlapping said first interval;
 c) selecting one hash value from one of said first and second blocks of hash values;
 d) searching for said hash value in the other one of said first and second blocks of hash values;
 e) calculating a difference between the first and second blocks of hash values in which the hash value found in step (d) has the same position as the selected hash value in the other one of said first and second blocks;
 f) repeating steps (c)–(e) for a further selected hash value until said difference is lower than a predetermined threshold or until the number of hash values to be selected is lower than a predetermined threshold; and
 g) concluding to a correct operation of said signal transformation if the difference is lower than a predetermined threshold or concluding to a false operation of said signal transformation if the number of hash values to be selected is lower than a predetermined threshold.

17. A method according to claim 16, wherein the further selected hash value is another hash value of the first block of hash values.

18. A method according to claim 16, wherein the further selected hash value is obtained by reversing a bit of the previously selected hash value.

19. A method according to claim 18, further comprising the steps of receiving information indicative of the reliability of the bits of the selected hash value, and using said information to determine whether to use the selected hash value.

20. A method according to claim 18, further comprising the steps of receiving information indicative of the reliability of the bits of the selected hash value, and using said information to determine the bit to be reversed.

* * * * *